US012802770B2

(12) United States Patent
Lin et al.

(10) Patent No.: US 12,802,770 B2
(45) Date of Patent: Nov. 17, 2026

(54) MEMORY APPARATUS HAVING A MEMORY OUTPUT MASKING MECHANISM

(71) Applicant: REALTEK SEMICONDUCTOR CORPORATION, Hsinchu (TW)

(72) Inventors: Sheng-Lin Lin, Hsinchu (TW); Shih-Chieh Lin, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 157 days.

(21) Appl. No.: 19/019,589

(22) Filed: Jan. 14, 2025

(65) Prior Publication Data

US 2025/0246256 A1 Jul. 31, 2025

(30) Foreign Application Priority Data

Jan. 26, 2024 (TW) ................................ 113103213

(51) Int. Cl.
*G11C 29/14* (2006.01)
*G11C 29/12* (2006.01)
*G11C 29/32* (2006.01)

(52) U.S. Cl.
CPC ........ *G11C 29/32* (2013.01); *G11C 29/12015* (2013.01); *G11C 29/14* (2013.01); *G11C 2029/3202* (2013.01)

(58) Field of Classification Search
CPC ... G11C 29/32; G11C 29/12015; G11C 29/14; G11C 2029/3202
See application file for complete search history.

(56) References Cited

U.S. PATENT DOCUMENTS

2005/0097418 A1* 5/2005 Anzou ........... G01R 31/318555 714/733
2023/0343405 A1 10/2023 Casarsa

FOREIGN PATENT DOCUMENTS

CN 116935908 A 10/2023

OTHER PUBLICATIONS

V.R. Devanathan et al., Techniques to improve memory interface test quality for complex SoCs, 2011 IEEE.
OA letter of a counterpart TW application (appl. No. 113103213) mailed on Nov. 21, 2024.

* cited by examiner

*Primary Examiner* — Xiaochun L Chen
(74) *Attorney, Agent, or Firm* — WPAT, PC

(57) ABSTRACT

The present disclosure discloses a memory apparatus having a memory output masking mechanism. A memory block includes a memory circuit and a memory bypass circuit. The memory circuit is controlled to be activated or deactivated by an actual driving signal. The memory bypass circuit is controlled by an actual mode control signal to output a data output signal as an output signal when the actual mode control signal is at a non-bypass state and output an access signal and an actual driving signal as the output signal when the actual mode control signal is at a bypass state. A masking circuit receives a driving signal and a mode control signal from a masking control circuit and generates the actual driving signal at a deactivating state and the actual mode control signal at the bypass state when the masking control signal is at a masking state.

11 Claims, 8 Drawing Sheets

MEMORY APPARATUS HAVING A MEMORY OUTPUT MASKING MECHANISM

BACKGROUND OF THE INVENTION

1. Field of the Invention

The present disclosure relates to a memory apparatus having a memory output masking mechanism.

2. Description of Related Art

After an integrated circuit is manufactured, an automatic test pattern generation (ATPG) tool is used to generate scan test patterns having high fault coverage and perform scan test through a scan chain to find out the chips including logic circuits having such as, but not limited to stuck-at faults and delay faults. Besides, in order to find out the chips including memories with defects, a built-in self-test (BIST) circuit in the memory circuit is used to perform test on the memory.

However, the test methods described above cannot perform test on the delay faults of a path between an external function circuit and the memory. A test mechanism is required to keep the memory circuit activated and perform test on the path between the external function circuit and the memory. Some test patterns that perform the test described above may deactivate the memory circuit such that an output of an unknown state is generated. The test operation complexity is thus increased and the test efficiency is decreased.

SUMMARY OF THE INVENTION

In consideration of the problem of the prior art, an object of the present disclosure is to provide a memory apparatus having a memory output masking mechanism.

The present invention discloses a memory apparatus having a memory output masking mechanism that includes a memory block, a masking circuit and a masking control circuit. The memory block includes a memory circuit and a memory bypass circuit. The memory circuit is configured to be controlled by an actual driving signal to be activated when the actual driving signal is at an enabling state and deactivated when the actual driving signal is at a disabling state, wherein the memory circuit receives an access signal to operate accordingly when being activated to generate a data output signal. The memory bypass circuit is configured to be controlled by an actual mode control signal to output the data output signal to be an output signal when the actual mode control signal is at a non-bypass state and output the access signal and the actual driving signal to be the output signal when the actual mode control signal is at a bypass state. The masking circuit is configured to receive a driving signal and a mode control signal, and to be controlled by a masking control signal to generate the actual driving signal and the actual mode control signal, wherein the actual driving signal is at the disabling state and the actual mode control signal is at the bypass state when the masking control signal is at a masking state. The masking control circuit is configured to receive and output the masking control signal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a memory apparatus having a memory output masking mechanism to dispose the masking circuit, use the masking control signal at the masking state to deactivate the memory circuit and simultaneously bypass the memory circuit to avoid the output of the unknown state from the deactivated memory circuit that affecting the test results.

Figure 1:
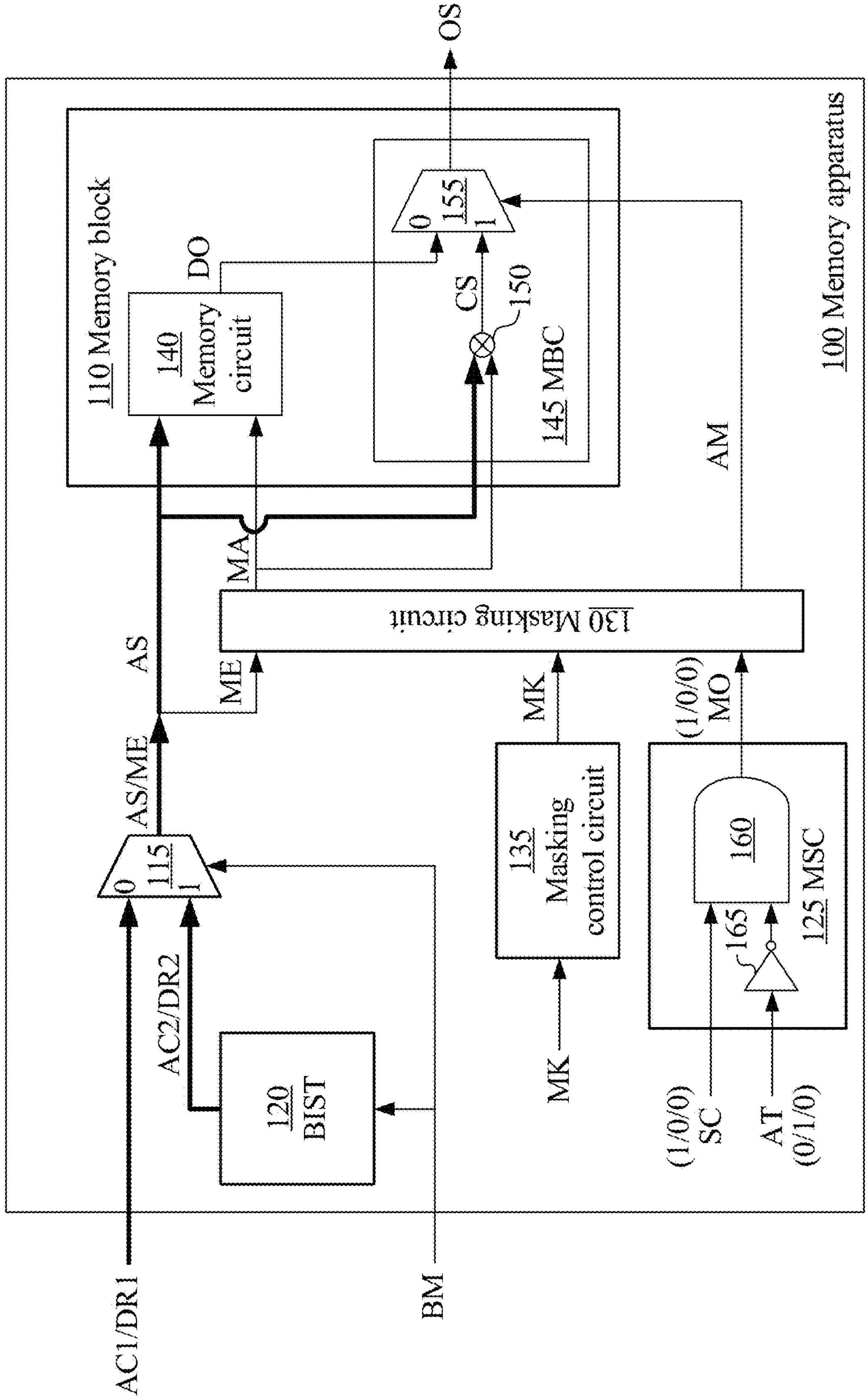
FIG. 1 illustrates a block diagram of a memory apparatus having a memory output masking mechanism according to an embodiment of the present invention.

Reference is now made to FIG. 1. FIG. 1 illustrates a block diagram of a memory apparatus 100 having a memory output masking mechanism according to an embodiment of the present invention. The memory apparatus 100 includes a memory block 110, an input multiplexer 115, a built-in self-test control circuit 120 (abbreviated as BIST in the figure), a mode selecting circuit 125 (abbreviated as MSC in the figure), a masking circuit 130 and a masking control circuit 135.

The memory block 110 includes a memory circuit 140 and a memory bypass circuit 145 (abbreviated as MBC in the figure).

In an embodiment, the memory circuit 140 is a static random access memory (SRAM) configured to be controlled by an actual driving signal MA to be activated when the actual driving signal MA is at an enabling state and deactivated when the actual driving signal MA is at a disabling state. In an embodiment, the enabling state of the actual driving signal MA is a high state and the disabling state of the actual driving signal MA is a low state.

The memory circuit 140 receives an access signal AS to operate accordingly when being activated to generate a data output signal DO. In an embodiment, the access signal AS may include such as, but not limited to an input data signal, an address signal, a write enable signal, a read enable signal or other signals (not illustrated in the figure) used to access the memory circuit 140. In an embodiment, the memory circuit 140 may receive the signals described above through different input terminals. The present invention is not limited thereto.

The memory bypass circuit 145 is configured to be controlled by an actual mode control signal AM to output the data output signal DO to be an output signal OS when the actual mode control signal AM is at a non-bypass state and output the access signal AS and the actual driving signal MA to be the output signal OS when the actual mode control signal AM is at the bypass state. In an embodiment, the non-bypass state of the actual mode control signal AM is a low state and the bypass state of the actual mode control signal AM is a high state.

In an embodiment, the memory bypass circuit 145 includes a bit-compressing circuit 150 and a multiplexer 155.

The bit-compressing circuit 150 may include such as, but not limited to at least one XOR (exclusive or) gate configured to compress the access signal AS and the actual driving signal MA to generate a compressed signal CS. In an embodiment, the bit-compressing circuit 150 compress the access signal AS and the actual driving signal MA to be the compressed signal CS having the same number of bits as the data output signal DO.

In a numerical example, when the data output signal DO is an 8-bit signal, the bit-compressing circuit 150 may compress the access signal AS and the actual driving signal MA having total 13 bits to be the 8-bit compressed signal CS. It is appreciated that the number of bits described above is merely an example. The present invention is not limited thereto.

The multiplexer 155 is configured to output the data output signal DO to be the output signal OS when the actual mode control signal AM is at the non-bypass state. The multiplexer 155 is configured to bypass the memory circuit 140 and output the compressed signal CS (the access signal AS and the actual driving signal MA that are compressed) to be output signal OS when the actual mode control signal AM is at the bypass state.

In an embodiment, the non-bypass state of the actual mode control signal AM is a low state and the bypass state of the actual mode control signal AM is a high state. In FIG. 1, the high state is labeled as 1 and the low state is labeled as 0 next to a side of the multiplexer 155 that receives the data output signal DO and the compressed signal CS to indicate that the selection that the multiplexer 155 makes according to the state of the actual mode control signal AM.

The input multiplexer 115 is configured to receive a group of signals including a first access signal AC1 and a first driving signal DR1 from an external circuit (not illustrated in the figure), and receive another group of signals including a second access signal AC2 and a second driving signal DR2 from the built-in self-test control circuit 120.

The input multiplexer 115 is further configured to receive a built-in self-test mode control signal BM to operate according to a non-built-in self-test mode state and a built-in self-test mode state of the built-in self-test mode control signal BM.

When the built-in self-test mode control signal BM is at a non-built-in self-test mode state, the memory apparatus 100 operates in a non-built-in self-test mode, where the non-built-in self-test mode is one of a function mode, a scan test mode and an at-speed test mode. Under such a condition, the input multiplexer 115 selects the first access signal AC1 to be outputted as the access signal AS and selects the first driving signal DR1 to be outputted as a driving signal ME.

When the built-in self-test mode control signal BM is at the built-in self-test mode state, the memory apparatus 100 operates in a built-in self-test mode. Under such a condition, the input multiplexer 115 selects the second access signal AC2 to be outputted as the access signal AS and selects the second driving signal DR2 to be outputted as the driving signal ME. The built-in self-test mode state corresponds to a built-in self-test mode.

In an embodiment, the non-built-in self-test mode state of the built-in self-test mode control signal BM is a low state and the built-in self-test mode state of the built-in self-test mode control signal BM is a high state. In FIG. 1, the high state is labeled as 1 and the low state is labeled as 0 next to a side of the multiplexer 115 that receives the first access signal AC1 and the second access signal AC2 to indicate that the selection that the input multiplexer 115 makes according to the state of the built-in self-test mode control signal BM.

The mode selecting circuit 125 is configured to receive a scan test mode control signal SC and an at-speed test mode control signal AT to generate a mode control signal MO accordingly.

In an embodiment, when the scan test mode control signal SC is at a scan test mode state and the at-speed test mode control signal AT is at a non-at-speed test mode state, the memory apparatus 100 operates in a scan test mode (which belongs to the non-built-in self-test mode). Under such a condition, the mode selecting circuit 125 sets the mode control signal MO to be at the bypass state.

In an embodiment, when the scan test mode control signal SC is at the scan test mode state and the at-speed test mode control signal AT is at an at-speed test mode state, the memory apparatus 100 operates in an at-speed test mode (which belongs to the non-built-in self-test mode). Under such a condition, the mode selecting circuit 125 sets the mode control signal MO to be at a non-bypass state.

In an embodiment, when the scan test mode control signal SC is at a non-scan test mode state and the at-speed test mode control signal AT is at the non-at-speed test mode state, the memory apparatus 100 operates in a function mode (which belongs to the non-built-in self-test mode) or in a built-in self-test mode. Under such a condition, the mode selecting circuit 125 sets the mode control signal MO to be at non-bypass state.

In practical implementation, the mode selecting circuit 125 can be implemented by a combination of logic circuits. In an embodiment, as illustrated in FIG. 1, the mode selecting circuit 125 includes an AND gate 160 and an inverter 165. The AND gate 160 includes a first input terminal, a second input terminal and an output terminal. The first input terminal is configured to receive the scan test mode control signal SC. The second input terminal is configured to receive the at-speed test mode control signal AT through the inverter 165. The output terminal is configured to generate the mode control signal MO.

Under the combination of the logic circuits, each of the scan test mode state, the at-speed test mode state and the bypass state is a high state, and each of the non-scan test mode state, the non-at-speed test mode state and the non-bypass state is a low state. In FIG. 1, the high state is labeled as 1 and the low state is labeled as 0 next to each of these signals.

The masking circuit 130 is configured to receive the driving signal ME and the mode control signal MO and to be controlled by a masking control signal MK to generate the actual driving signal MA and the actual mode control signal AM according to the state of the masking control signal MK. The masking control circuit 135 is configured to receive and output the masking control signal MK to the masking circuit 130 to control the masking circuit 130.

More specifically, the masking control signal MK is at a masking state such that the masking circuit 130 sets the actual driving signal MA to be at the disabling state and sets the actual mode control signal AM to be at bypass state.

Under such a condition, the memory circuit 140 is deactivated and the memory bypass circuit 145 bypasses the memory circuit 140 and the compressed signal CS is outputted to be the output signal OS.

When the masking control signal MK is at a non-masking state, the masking circuit 130 outputs the driving signal ME to be the actual driving signal MA and outputs the mode control signal MO to be the actual mode control signal AM.

Under such a condition, the memory circuit 140 is activated or deactivated depending on the state of the driving signal ME. In an embodiment, the first driving signal DR1 received the input multiplexer 115 from the external circuit and the second driving signal DR2 received the input multiplexer 115 from the built-in self-test control circuit by respectively have the disabling state or the enabling state. As a result, the driving signal ME outputted by the input multiplexer 115 according to one of the first driving signal DR1 and the second driving signal DR2 also has the disabling state or the enabling state such that the memory circuit 140 is activated or deactivated accordingly.

On the other hand, the memory bypass circuit 145 bypasses the memory circuit 140 or not depending on the state of the mode control signal MO. As described above, the scan test mode control signal SC and the at-speed test mode control signal AT received by the mode selecting circuit 125 determine whether the mode control signal MO is at the bypass state or the non-bypass state such that the memory bypass circuit 145 determine whether the memory circuit 140 is bypassed or not accordingly.

The following paragraphs describe the operation of the memory apparatus 100 based on the masking control signal MK outputted by the masking control circuit 135 in different modes.

Reference is now made to FIG. 2A to FIG. 2E. FIG. 2A to FIG. 2E respectively illustrate the operation of the memory apparatus 100 in different modes according to an embodiment of the present invention. In these figures, the signals not selected by the multiplexers in the memory apparatus 100 are illustrated as dotted lines and the states of the signals, either high or low, are labeled. The masking state and the non-masking state of the masking control signal MK are respectively labeled as 1 and 0.

Figure 2A:
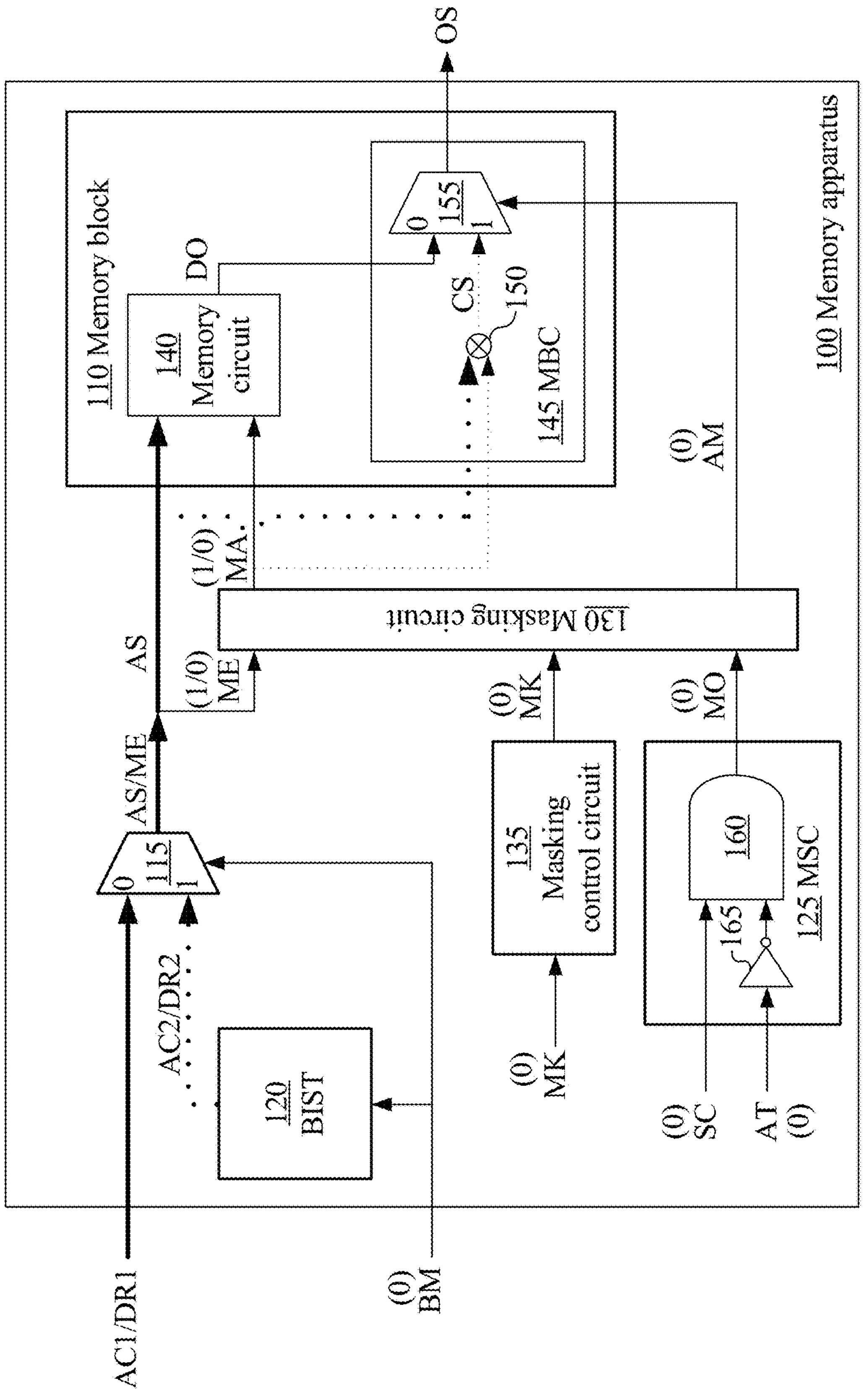
FIG. 2A to FIG. 2E respectively illustrate the operation of the memory apparatus in different modes according to an embodiment of the present invention.

FIG. 2A illustrates the operation of the memory apparatus 100 under the condition that the function mode is operated and the masking control signal MK is at the non-masking state.

The input multiplexer 115 selects the first access signal AC1 and the first driving signal DR1 to be the access signal AS and the driving signal ME according to the built-in self-test mode control signal BM at the non-built-in self-test mode state. Under such a condition, the first access signal AC1 and the first driving signal DR1 are generated by the function circuit.

The masking circuit 130 outputs the driving signal ME to be the actual driving signal MA according to the masking control signal MK at the non-masking state such that the memory circuit 140 receives the access signal AS and the actual driving signal MA to generate the data output signal DO.

The mode selecting circuit 125 sets the mode control signal MO to be at non-bypass state according to the scan test mode control signal SC at the non-scan test mode state and the at-speed test mode control signal AT at the non-at-speed test mode state.

The masking circuit 130 outputs the mode control signal MO to be the actual mode control signal AM according to the masking control signal MK at the non-masking state such that the multiplexer 155 does not bypass the memory circuit 140 according to the actual mode control signal AM at the non-bypass state and the data output signal DO is outputted to be the output signal OS. Under such a condition, the output signal OS can be received by another external function circuit.

Figure 2B:
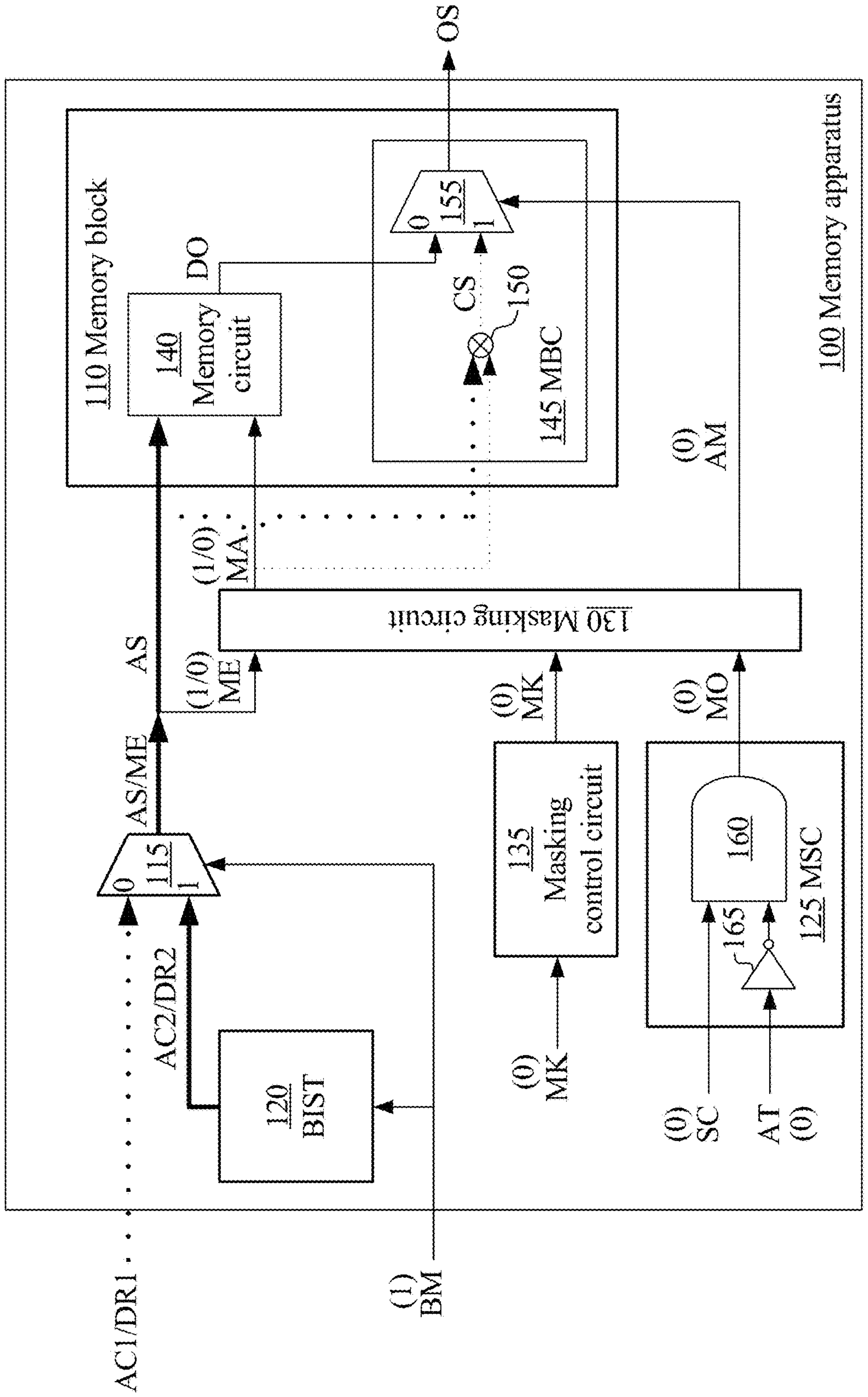

FIG. 2B illustrates the operation of the memory apparatus 100 under the condition that the built-in self-test mode is operated and the masking control signal MK is at the non-masking state.

The input multiplexer 115 selects the second access signal AC2 and the second driving signal DR2 to be the access signal AS and the driving signal ME according to the built-in self-test mode control signal BM at the built-in self-test mode state. Under such a condition, the second access signal AC2 and the second driving signal DR2 are generated by the built-in self-test control circuit 120.

The masking circuit 130 outputs the driving signal ME to be the actual driving signal MA according to the masking control signal MK at the non-masking state such that the memory circuit 140 receives the access signal AS and the actual driving signal MA to generate the data output signal DO.

The mode selecting circuit 125 sets the mode control signal MO to be at non-bypass state according to the scan test mode control signal SC at the non-scan test mode state and the at-speed test mode control signal AT at the non-at-speed test mode state.

The masking circuit 130 outputs the mode control signal MO to be the actual mode control signal AM according to the masking control signal MK at the non-masking state such that the multiplexer 155 does not bypass the memory circuit 140 according to the actual mode control signal AM at the non-bypass state and the data output signal DO is outputted to be the output signal OS. Under such a condition, the output signal OS can be fed to the built-in self-test control circuit 120 to be evaluated.

Figure 2C:
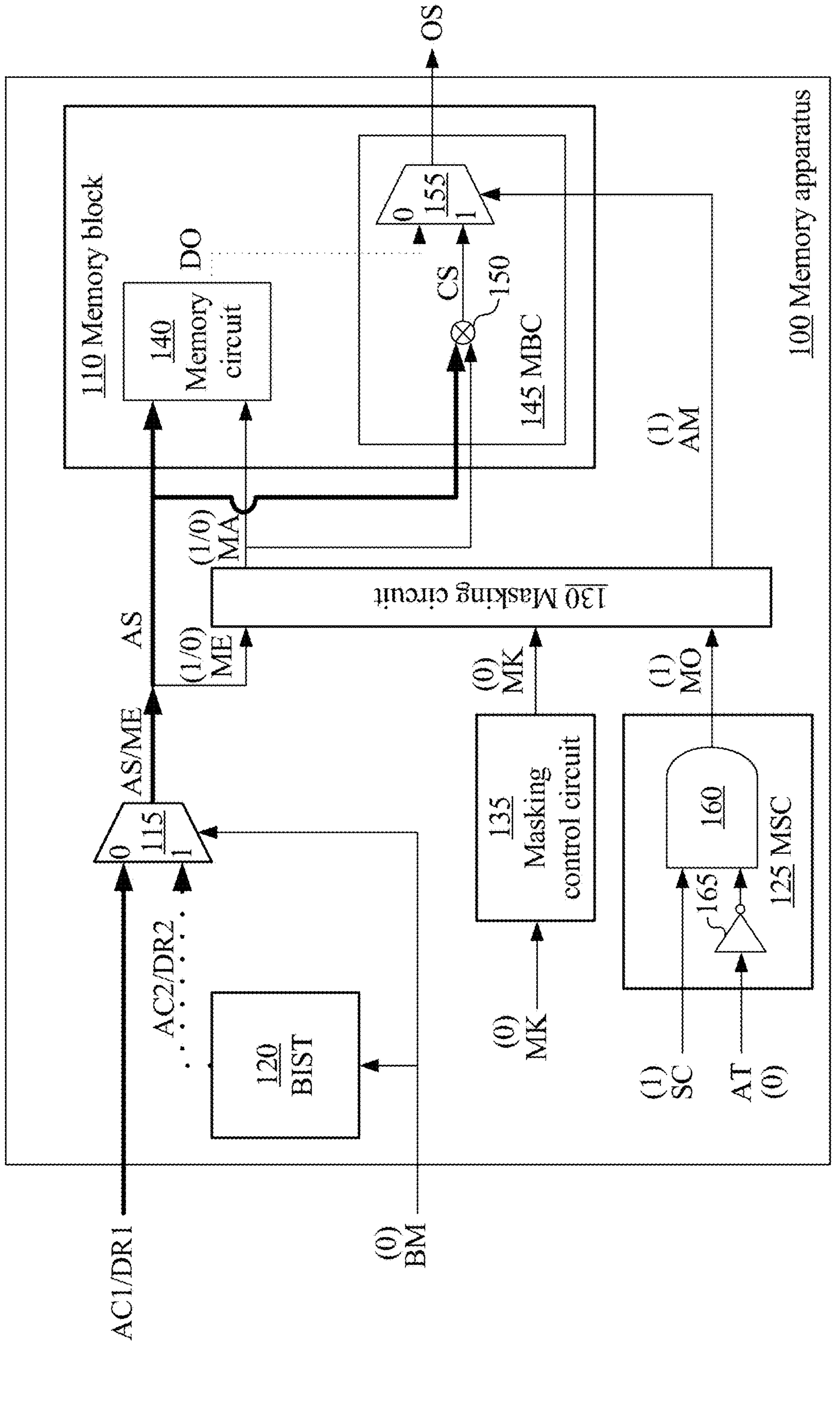

FIG. 2C illustrates the operation of the memory apparatus 100 under the condition that the scan test mode is operated and the masking control signal MK is at the non-masking state.

The input multiplexer 115 either selects the first access signal AC1 and the first driving signal DR1 to be the access signal AS and the driving signal ME according to the built-in self-test mode control signal BM at the non-built-in self-test mode state, or selects the second access signal AC2 and the second driving signal DR2 to be the access signal AS and the driving signal ME according to the built-in self-test mode control signal BM at the built-in self-test mode state. In such an example, the condition that the input multiplexer 115 selects the first access signal AC1 and the first driving signal DR1 to be the access signal AS and the driving signal ME according to the built-in self-test mode control signal BM at the non-built-in self-test mode state is used to describe the operation. Under such a condition, the first access signal AC1 and the first driving signal DR1 are generated by such as, but not limited to an ATPG tool.

The masking circuit 130 outputs the driving signal ME to be the actual driving signal MA according to the masking control signal MK at the non-masking state such that the memory circuit 140 receives the access signal AS and the actual driving signal MA to generate the data output signal DO.

The mode selecting circuit 125 sets the mode control signal MO to be at the bypass state according to the scan test mode control signal SC at the scan test mode state and the at-speed test mode control signal AT at the non-at-speed test mode state.

The masking circuit 130 outputs the mode control signal MO to be the actual mode control signal AM according to the masking control signal MK at the non-masking state such that the multiplexer 155 bypasses the memory circuit 140 according to the actual mode control signal AM at the bypass state and the compressed signal CS is outputted to be the output signal OS. Under such a condition, the output signal OS can be received by an external circuit related to the scan chain to perform subsequent evaluation.

Figure 2D:
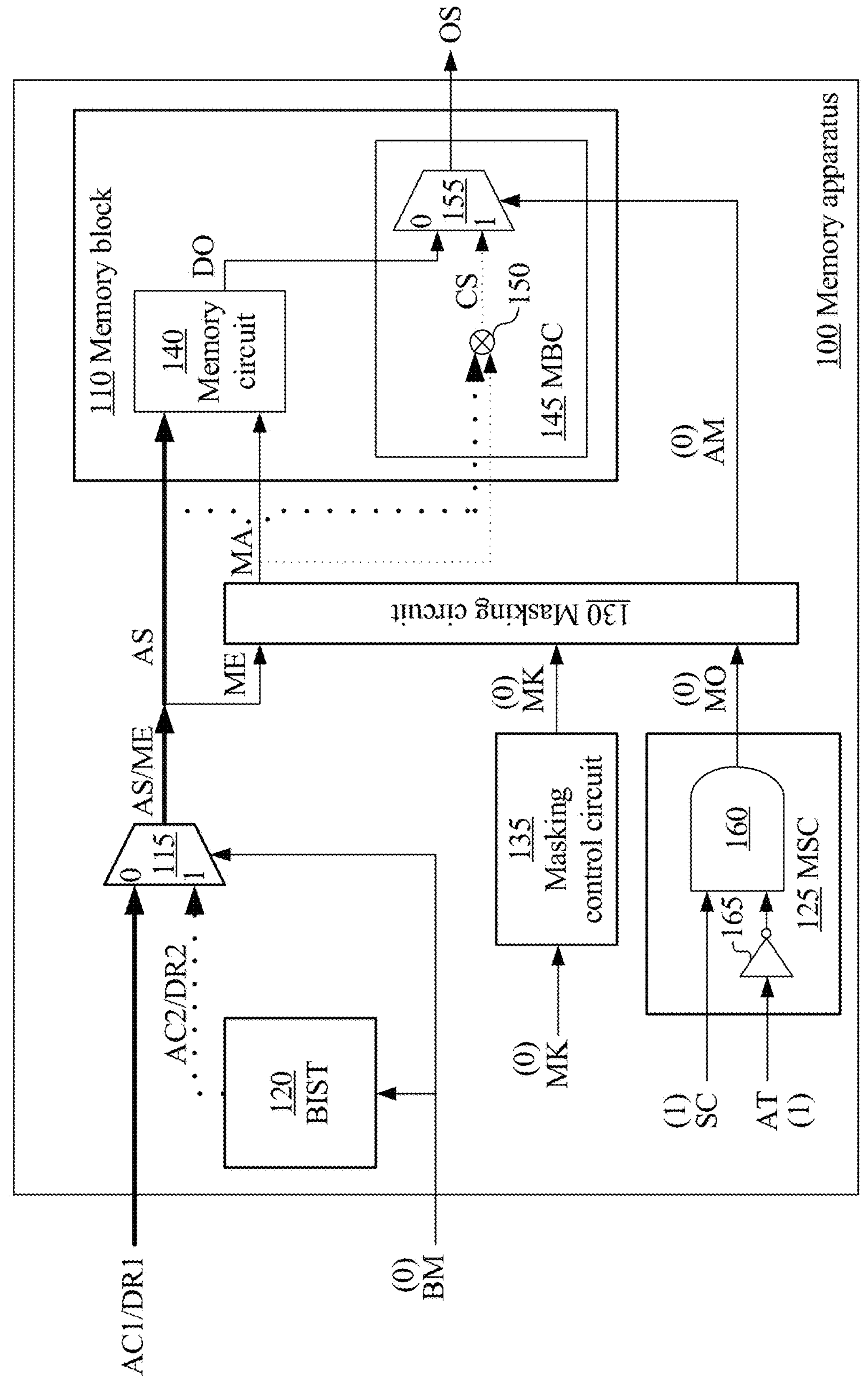

FIG. 2D illustrates the operation of the memory apparatus 100 under the condition that the at-speed test mode is operated and the masking control signal MK is at the non-masking state.

The input multiplexer 115 selects the first access signal AC1 and the first driving signal DR1 to be the access signal AS and the driving signal ME according to the built-in self-test mode control signal BM at the non-built-in self-test mode state. Under such a condition, the first access signal AC1 and the first driving signal DR1 are generated by such as, but not limited to an ATPG tool.

The masking circuit 130 outputs the driving signal ME to be the actual driving signal MA according to the masking control signal MK at the non-masking state such that the memory circuit 140 receives the access signal AS and the actual driving signal MA to generate the data output signal DO.

The mode selecting circuit 125 sets the mode control signal MO to be at the non-bypass state according to the scan test mode control signal SC at the scan test mode state and the at-speed test mode control signal AT at the at-speed test mode state.

The masking circuit 130 outputs the mode control signal MO to be the actual mode control signal AM according to the masking control signal MK at the non-masking state such that the multiplexer 155 does not bypass the memory circuit 140 according to the actual mode control signal AM at the non-bypass state and the data output signal DO is outputted to be the output signal OS. Under such a condition, the output signal OS is received by an external circuit related to the scan chain to perform subsequent evaluation.

According to FIG. 2D, the operation of the memory circuit 140 in the at-speed test mode is closest to the operation of the memory circuit 140 in the function mode, in which the fault of such as, but not limited a transition delay fault of the timing between the memory circuit 140 and an external circuit (i.e., the source of the first access signal AC1 and the first driving signal DR1) can be detected.

In some applications, the memory circuit 140 in the at-speed test mode may need to be deactivated. However, the deactivation of the memory circuit 140 results in the unknown state of the data output signal DO and the output signal OS generated accordingly. The complexity of the test pattern generation tool thus increases. Not only the detection efficiency decreases, but also the run time increases. The test coverage may drop as well such that more test pattern counts are required to perform detection.

Figure 2E:
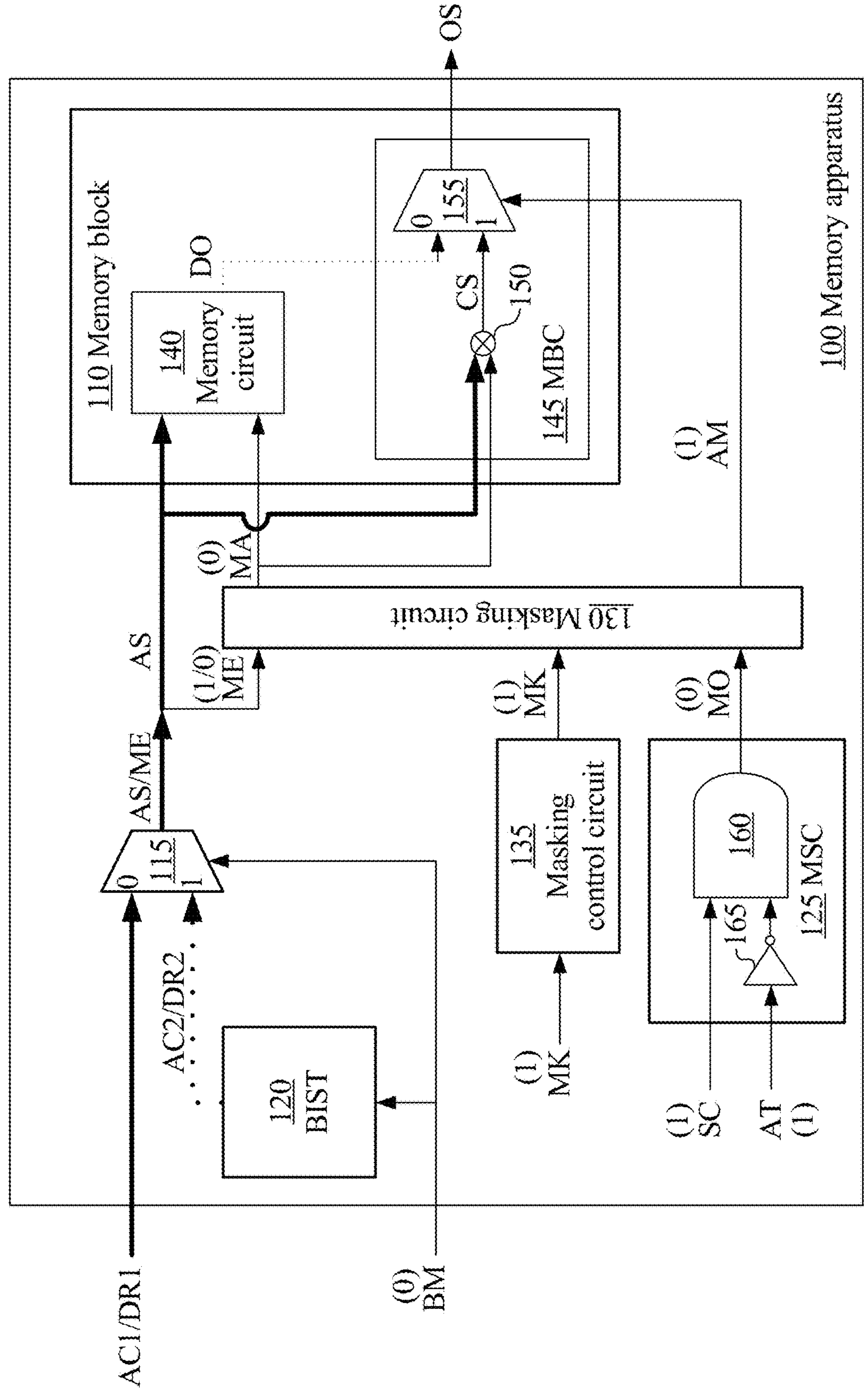

FIG. 2E illustrates the operation of the memory apparatus 100 under the condition that the at-speed test mode is operated and the masking control signal MK is at the masking state.

The input multiplexer 115 selects the first access signal AC1 and the first driving signal DR1 to be the access signal AS and the driving signal ME according to the built-in self-test mode control signal BM at the non-built-in self-test mode state. The masking circuit 130 sets the actual driving signal MA to be at the disabling state according to the masking control signal MK at the masking state.

The mode selecting circuit 125 sets the mode control signal MO to be at non-bypass state according to the scan test mode control signal SC at the scan test mode state and the at-speed test mode control signal AT at the at-speed test mode state. The masking circuit 130 sets the actual mode control signal AM to be at the bypass state according to the masking control signal MK at the masking state such that the multiplexer 155 bypasses the memory circuit 140 according to the actual mode control signal AM at the bypass state and the compressed signal CS is outputted to be the output signal OS.

The memory apparatus 100 disposes the masking circuit therein, uses the masking control signal MK at the masking state in the at-speed test mode to deactivate the memory circuit 140 and simultaneously bypass the memory circuit 140 to avoid the output of the unknown state from the deactivated memory circuit 140 that affecting the test results.

It is appreciated that in other modes, the memory apparatus 100 may accomplish the masking mechanism to mask the unknown state outputted by the deactivated memory circuit 140 by using the masking circuit 130 when the masking is required. The present invention is not limited thereto.

In practical implementation, the masking circuit 130 can be implemented by a combination of logic circuits and the masking control circuit 135 can be implemented by registers. An example of the implementation of the masking circuit 130 and the masking control circuit 135 is described in the following paragraphs.

Figure 3:
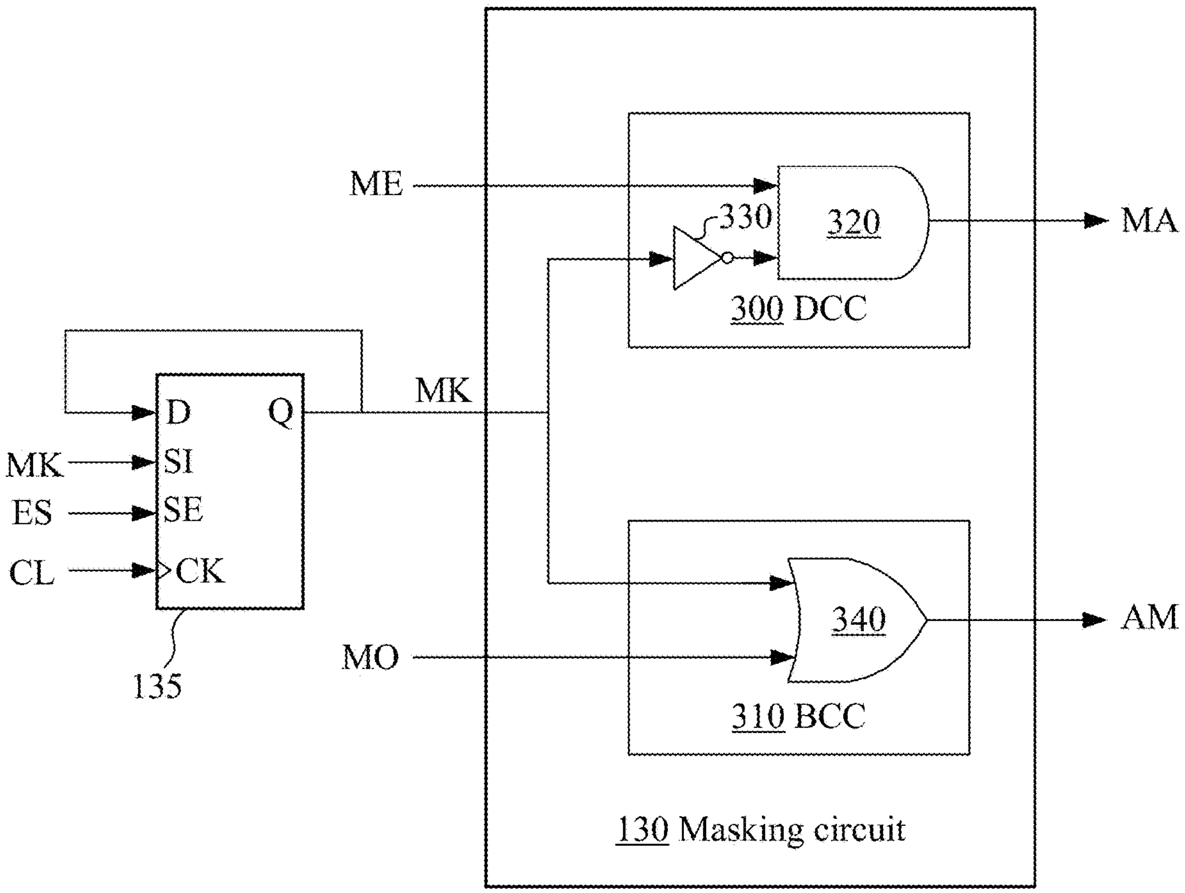
FIG. 3 illustrates a block diagram of the masking circuit and the masking control circuit according to an embodiment of the present invention.

Reference is now made to FIG. 3. FIG. 3 illustrates a block diagram of the masking circuit 130 and the masking control circuit 135 according to an embodiment of the present invention. The masking circuit 130 includes a driving control circuit 300 (abbreviated as DCC in the figure) and a bypass control circuit 310 (abbreviated as BCC in the figure).

The driving control circuit 300 is configured to receive the driving signal ME and the masking control signal MK to generate the actual driving signal MA accordingly to the memory circuit 140 in FIG. 1.

In the present embodiment, the driving control circuit 300 includes an AND gate 320 and an inverter 330. The AND gate 320 includes a first input terminal, a second input terminal and an output terminal. The first input terminal is configured to receive the driving signal ME. The second input terminal is configured to receive the masking control signal MK through the inverter 330. The output terminal is configured to generate the actual driving signal MA.

The bypass control circuit 310 is configured to receive the mode control signal MO and the masking control signal MK to generate the actual mode control signal AM accordingly to the memory bypass circuit 145 in FIG. 1. The bypass control circuit 310 includes an OR gate 340. The OR gate 340 includes a first input terminal, a second input terminal and an output terminal. The first input terminal is configured to receive the masking control signal MK. The second input terminal is configured to receive the mode control signal MO. The output terminal is configured to generate the actual mode control signal AM.

As a result, when the masking control signal MK is at the masking state and the masking state is the high state, the AND gate 320 of the driving control circuit 300 receives the driving signal ME and the inversed masking control signal MK that is the low state. No matter what state of the driving signal ME is, the driving control circuit 300 generates the actual driving signal MA that is the low state (corresponding to the disabling state).

On the other hand, when the masking control signal MK is at the masking state and the masking state is the high state, the OR gate 340 of the bypass control circuit 310 receives the mode control signal MO and the masking control signal MK at the high state. No matter what state that the mode control signal MO is, the driving control circuit 300 generates the actual mode control signal AM that is the high state (corresponding to the bypass state).

In an embodiment, the masking control circuit 135 is a masking control register disposed in the scan chain and, as illustrated in FIG. 3, includes a data input terminal D, a data output terminal Q, a scan input terminal SI, a scan enabling terminal SE and a clock receiving terminal CK.

The data output terminal Q is electrically coupled to data input terminal D. The scan enabling terminal SE is configured to receive a scan enabling signal ES. The scan input terminal SI is electrically coupled to the scan chain (not illustrated in the figure). The clock receiving terminal CK is configured to receive a clock signal CL and operates accordingly.

The scan input terminal SI is configured to receives the masking control signal MK when the scan enabling terminal SE receives the scan enabling signal ES at a scan enabling state, and output the masking control signal MK at the data output terminal Q. When the scan enabling terminal SE receives the scan enabling signal ES at an non-scan enabling state, the data input terminal D receives the masking control signal MK outputted by the data output terminal Q to maintain the state of the masking control signal MK.

Figure 4:
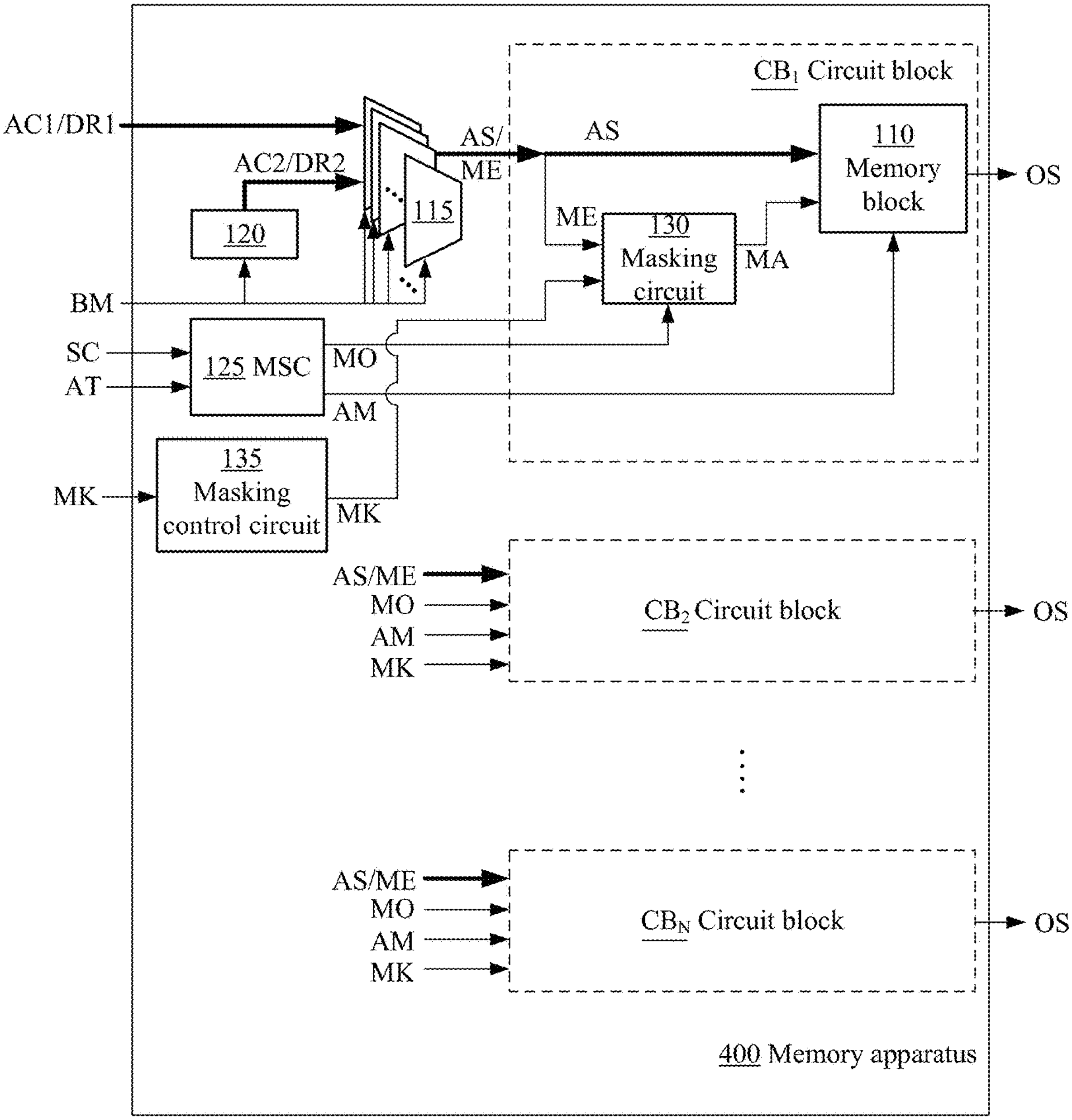
FIG. 4 illustrates a block diagram of a memory apparatus having a memory output masking mechanism according to an embodiment of the present invention.

Reference is now made to FIG. 4. FIG. 4 illustrates a block diagram of a memory apparatus 400 having a memory output masking mechanism according to an embodiment of the present invention.

The memory apparatus 400 includes the input multiplexers 115, the built-in self-test control circuit 120, the mode selecting circuit 125 and the masking control circuit 135 in FIG. 1. The number of the input multiplexers 115 is N.

The memory apparatus 400 further includes N circuit blocks $CB_1$~$CB_N$ each having the memory block 110 and the masking circuit 130 in FIG. 1. In FIG. 4, only the configuration of the circuit block $CB_1$ is illustrated in detail. As a result, the memory apparatus 400 actually includes N memory blocks 110 and N masking circuits 130, and the N memory blocks 110 and the N masking circuits 130 correspond to each other, N being an integer larger than 1.

The N circuit blocks $CB_1$~$CB_N$ and the N input multiplexers 115 are actually electrically coupled to each other in a one-to-one relation. However, in order to avoid the complexity of the figure, the connections among the N circuit blocks $CB_1$~$CB_N$ and the N input multiplexers 115 are not illustrated in FIG. 4. Different groups of the circuit blocks and the input multiplexers can share the built-in self-test control circuit 120, the mode selecting circuit 125 and the masking control circuit 135, such that the N circuit blocks $CB_1$~$CB_N$ receive the signals from the built-in self-test control circuit 120, the mode selecting circuit 125 and the masking control circuit 135 through the corresponding N input multiplexers 115. The connection of each group of circuit blocks and the multiplexers with the built-in self-test control circuit 120, the mode selecting circuit 125 and the masking control circuit 135 and the operation thereof are identical to those described in FIG. 1. The detail is not described herein.

By using such a configuration, the N the masking circuits 130 together receive the masking control signal MK of a single masking control circuit 135 to simultaneously deactivate and bypass the memory circuits (not illustrated in FIG. 4) in a multiple of memory blocks 110. Such a configuration can greatly save the circuit area when memory apparatus 400 includes a multiple of memory blocks and operate the memory block elastically.

It is appreciated that the embodiments described above are merely an example. In other embodiments, it is appreciated that many modifications and changes may be made by those of ordinary skill in the art without departing, from the spirit of the invention. For example, the high state and the low state of the signals described in the embodiments above are merely an example. An opposite setting of the state of these signals can be used depending on practical requirements. Moreover, under the condition that the function of the memory apparatus is not affected, the combination of the logic circuits may be different depending on different settings of the state of the signals. The present invention is not limited to a specific signal state setting and a specific implementation of the logic circuit combination.

In summary, the memory apparatus having the memory output masking mechanism disposes the masking circuit, uses the masking control signal at the masking state to deactivate the memory circuit and simultaneously bypasses the memory circuit to avoid the output of the unknown state from the deactivated memory circuit that affecting the test results.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A memory apparatus having a memory output masking mechanism, comprising:

a memory block comprising:

a memory circuit configured to be controlled by an actual driving signal to be activated when the actual driving signal is at an enabling state and deactivated when the actual driving signal is at a disabling state, wherein the memory circuit receives an access signal to operate accordingly when being activated to generate a data output signal; and a memory bypass circuit configured to be controlled by an actual mode control signal to output the data output signal to be an output signal when the actual mode control signal is at a non-bypass state and output the access signal and the actual driving signal to be the output signal when the actual mode control signal is at a bypass state;

a masking circuit configured to receive a driving signal and a mode control signal, and to be controlled by a masking control signal to generate the actual driving signal and the actual mode control signal, wherein the actual driving signal is at the disabling state and the actual mode control signal is at the bypass state when the masking control signal is at a masking state; and a masking control circuit configured to receive and output the masking control signal.

2. The memory apparatus of claim 1, wherein the masking circuit outputs the driving signal to be the actual driving signal and outputs the mode control signal to be the actual mode control signal when the masking control signal is at a non-masking state.

3. The memory apparatus of claim 2, wherein the masking circuit comprises a driving control circuit that comprises an AND gate and an inverter, the AND gate comprising:

a first input terminal configured to receive the driving signal;

a second input terminal configured to receive the masking control signal through the inverter; and an output terminal configured to generate the actual driving signal.

4. The memory apparatus of claim 2, further comprising a built-in self-test (BIST) control circuit and an input multiplexer, the input multiplexer being configured to receive a first driving signal from a function circuit and a second driving signal from the built-in self-test control circuit, the first driving signal and the second driving signal respectively having the disabling state or the enabling state, and the built-in self-test control circuit and the input multiplexer further being configured to receive a built-in self-test mode control signal;

when the built-in self-test mode control signal is at non-built-in self-test mode state, the built-in self-test control circuit is disabled and the input multiplexer selects the first driving signal to be outputted as the driving signal, wherein the non-built-in self-test mode state corresponds to a non-built-in self-test mode, and the non-built-in self-test mode is one of a function mode, a scan test mode and an at-speed test mode; and when the built-in self-test mode control signal is at a built-in self-test mode state, the built-in self-test control circuit is enabled and the input multiplexer selects the second driving signal to be outputted as the driving signal, wherein the built-in self-test mode state corresponds to a built-in self-test mode.

5. The memory apparatus of claim 4, wherein the input multiplexer is further configured to receive a first access signal from and a second access signal from the built-in self-test control circuit;

when the built-in self-test mode control signal is at the non-built-in self-test mode state, the input multiplexer selects the first access signal to be outputted as the access signal;

when the built-in self-test mode control signal is at the built-in self-test mode state, the input multiplexer selects the second access signal to be outputted as the access signal.

6. The memory apparatus of claim 2, wherein the masking circuit includes a bypass control circuit that comprises an OR gate, the OR gate comprising:

a first input terminal configured to receive the masking control signal;

a second input terminal configured to receive the mode control signal; and an output terminal configured to generate the actual mode control signal.

7. The memory apparatus of claim 2, further comprising a mode selecting circuit configured to receive a scan test mode control signal and an at-speed test mode control signal to generate the mode control signal accordingly;

wherein when the scan test mode control signal is at a scan test mode state and the at-speed test mode control signal is at a non-at-speed test mode state, the mode selecting circuit sets the mode control signal to be at the bypass state;

when the scan test mode control signal is at the scan test mode state and the at-speed test mode control signal is at an at-speed test mode state, the mode selecting circuit sets the mode control signal to be at the non-bypass state; and when the scan test mode control signal is at a non-scan test mode state and the at-speed test mode control signal is at the non-at-speed test mode state, the mode selecting circuit sets the mode control signal to be at the non-bypass state.

8. The memory apparatus of claim 7, wherein the mode selecting circuit comprises an AND gate and an inverter, the AND gate comprising:

a first input terminal configured to receive the scan test mode control signal;

a second input terminal configured to receive the at-speed test mode control signal through the inverter; and an output terminal configured to generate the mode control signal, wherein each of the scan test mode state, the at-speed test mode state and the bypass state is a high state, and each of the non-scan test mode state, the non-at-speed test mode state and the non-bypass state is a low state.

9. The memory apparatus of claim 1, wherein the masking control circuit is a masking control register disposed in a scan chain and comprises:

a data input terminal;

a data output terminal electrically coupled to the data input terminal;

a scan enabling terminal configured to receive a scan enabling signal;

a scan input terminal electrically coupled to the scan chain and configured to receive the masking control signal when the scan enabling terminal receives the scan enabling signal at a scan enabling state and output the masking control signal at the data output terminal; and a clock receiving terminal configured to receive a clock signal and operate accordingly;

when the scan enabling terminal receives the scan enabling signal at a non-scan enabling state, the data input terminal receives the masking control signal outputted from the data output terminal.

10. The memory apparatus of claim 1, wherein the memory bypass circuit comprises:

a bit-compressing circuit configured to compress the access signal and the actual driving signal to generate a compressed signal;

a multiplexer configured to output the data output signal to be the output signal when the actual mode control signal is at the non-bypass state and output the compressed signal to be the output signal when the actual mode control signal is at the bypass state.

11. The memory apparatus of claim 1, wherein a number of each of the memory block and the masking circuit is N and the N memory blocks and the N masking circuits correspond to each other, the N the masking circuits together receive the masking control signal from the masking control circuit, N being an integer larger than 1.

* * * * *